United States Patent [19]

Vinter et al.

[11] Patent Number: 4,806,998
[45] Date of Patent: Feb. 21, 1989

[54] HETEROJUNCTION AND DUAL CHANNEL SEMICONDUCTOR FIELD EFFECT TRANSISTOR OR NEGATIVE TRANSCONDUCTIVE DEVICE

[75] Inventors: Borge Vinter, Paris; Armand Tardella, Montigny, both of France

[73] Assignee: Thomson-CSF, Paris, France

[21] Appl. No.: 67,109

[22] Filed: Jun. 25, 1987

[30] Foreign Application Priority Data

Jun. 30, 1986 [FR] France ................ 86 09441

[51] Int. Cl.⁴ .......................................... H01L 29/80
[52] U.S. Cl. ............................... 357/22; 357/58; 357/16; 357/4
[58] Field of Search .......... 357/22, 58, 22 A, 22 MD, 357/16, 4

[56] References Cited

U.S. PATENT DOCUMENTS

| | | | |
|---|---|---|---|
| 4,194,935 | 3/1980 | Dingle et al. | 357/4 X |
| 4,558,337 | 12/1985 | Sauniier et al. | 357/22 A |
| 4,688,061 | 8/1987 | Sakaki | 357/22 A |

FOREIGN PATENT DOCUMENTS

| | | | |
|---|---|---|---|
| 0155215 | 9/1985 | European Pat. Off. | |
| 58-114455 | 7/1983 | Japan | 357/4 |
| 59-86268 | 5/1984 | Japan | 357/22 MD |
| 61-27681 | 2/1986 | Japan | 357/4 |
| 2168847A | 6/1986 | United Kingdom. | |

OTHER PUBLICATIONS

Judaprawira et al., "Modulation-Doped MBE GaAs/N-Al$_x$Ga$_{1-x}$As MESFETs," *IEEE Electron Device Letters*, vol. ED1-2, No. 1, Jan. 1981, pp. 14-15.
Loreck et al., "Deep Level Analysis in (Al-Ga)As—GaAs MODFETs by Means of Low Frequency Noise Measurements," *IEDM Tech. Digest*, Dec. 5-7, 1983, pp. 107-110.
Sakaki, "Velocity-Modulation Transistor (VMT)—A New Field-Effect Transistor Concept," *Japanese Journal of Applied Physics*, vol. 21, No. 6, Jun. 1982, pp. 2381-2383.

*Primary Examiner*—Andrew J. James
*Assistant Examiner*—William A. Mintel
*Attorney, Agent, or Firm*—Roland Plottel

[57] ABSTRACT

A heterojunction semiconductor device which has a dual channel with a high mobility layer, a barrier layer and a low mobility layer. The barrier layer is thin enough for the carriers to pass from the low mobility layer to the high mobility layer by tunnel effect, during variations of the polarization electrical field of the dual channel. The device can be used as field effect transistors with a quick response time, without variation in the charge of the channel but with a variation in the mobility of the carriers; or as negative transconductance devices for oscillators or complementary transistors in integrated circuits.

9 Claims, 3 Drawing Sheets

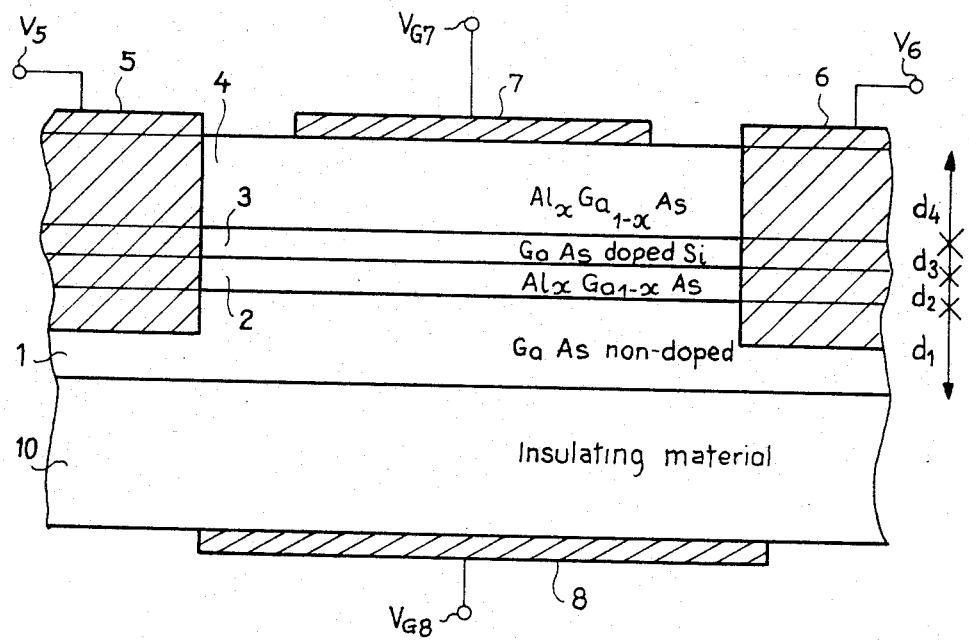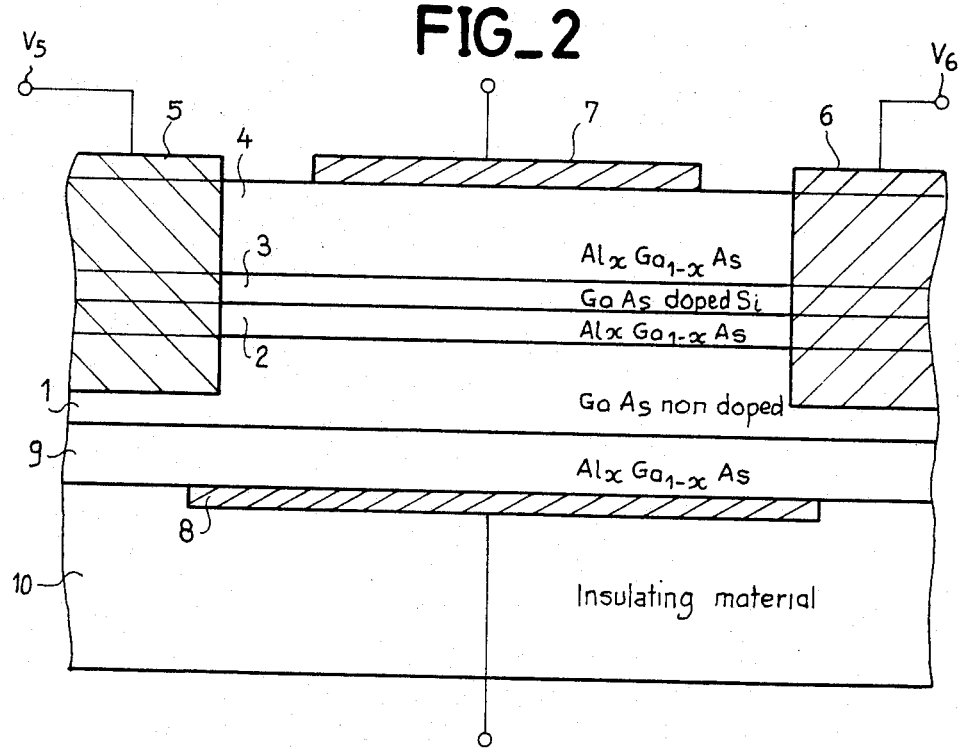

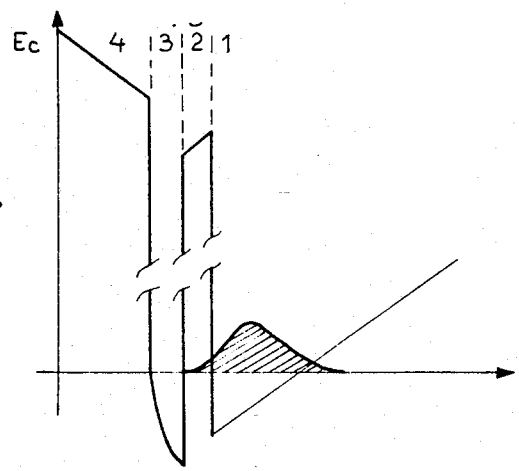
FIG_3-a
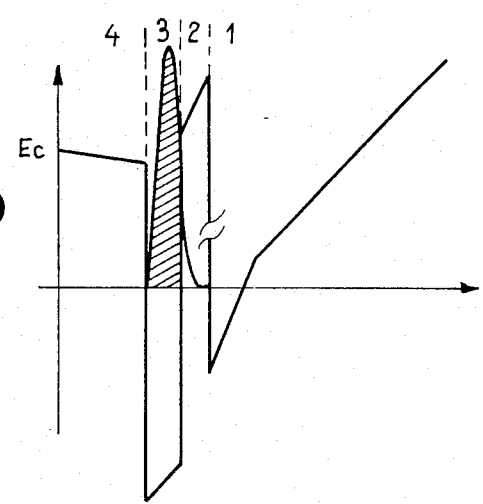
FIG_3-b
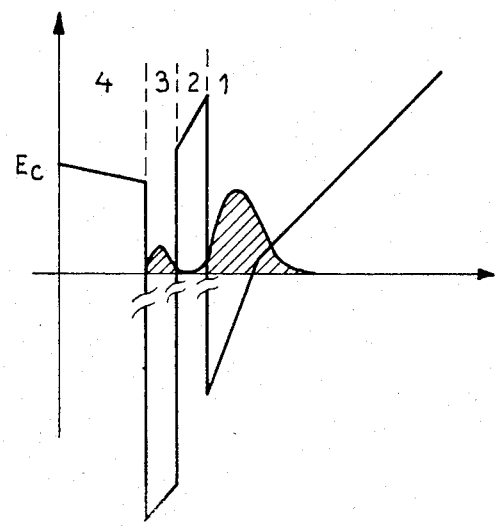
FIG_4

FIG_5
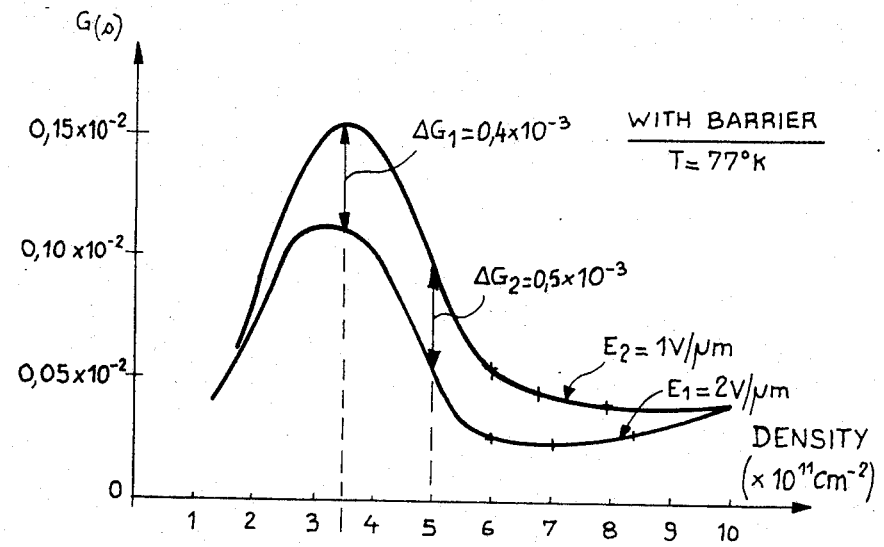
FIG_6
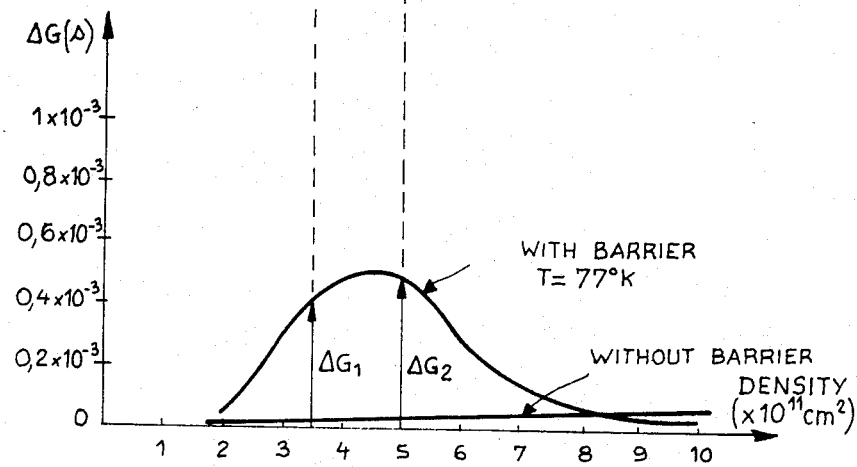

HETEROJUNCTION AND DUAL CHANNEL SEMICONDUCTOR FIELD EFFECT TRANSISTOR OR NEGATIVE TRANSCONDUCTIVE DEVICE

BACKGROUND OF THE INVENTION

1. Field of the Invention

The invention pertains to the field of semi-conductors and more particularly to a heterojunction field-effect transistor with a quick response time, this response time being determined no longer by a variation in the number of the carriers of the channel but by a variation in the speed of these carriers.

2. Description of the Prior Art

Generally, in field-effect transistors, the conductivity between two contacts, a source and a drain contact, is controlled by the voltage applied to a third contact known as the gate. Conventionally, in these field-effect transistors, the conductivity is controlled by the variation in the number of charge carriers under the gate, this variation being monotonous with the gate voltage.

For example, in a MESFET type transistor, the thickness of the conductive channel increases when a positive voltage is applied to the gate. Similarly, in an insulated gate MOSFET or a heterojunction TEGFET, the density of the charges under the gate increases monotonously with the voltage applied to the gate.

The European patent application No. 0091831 has described a field-effect transistor where the conductivity is determined no longer by the variation in the number of carriers under the gate but by the variation in the speed of these carriers. The solution proposed therein consists in creating a channel, in a semi-conductive layer, between two semi-conductive layers with a greater forbidden gap; by introducing a small number of donor impurities on one side of the channel and a large number of donor or acceptor impurities on the other side of the channel. The conductivity of this channel depends on the distribution of the charges. A normal gate and an additional gate placed in rear contact can be used to control the mean position of the distribution of charges in this canal. As a result, the mobility of the carriers can be modulated, without any variation in the number of these carriers, owing to the fact that these carriers are either in a high mobility zone or in a low mobility zone. This principle of operation has been clearly demostrated but the size of the effect is very low even at very low temperatures, for example, at a liquid helium temperature of 4° K.

SUMMARY OF THE INVENTION

The object of the invention is a semi-conductor device with a heterojunction and a dual channel, which may constitute a heterojunction field-effect transistor using the same effect, namely a variation in the speed of the carriers and no longer a variation in the quantity of these carriers. But, according to the invention, the structure is modified so as to very substantially increase this effect of modulation of mobility.

According to the invention, a semi-conductor device with a heterojunction comprises an insulating substrate (a heterojunction along which there extends a conductive channel between two electrodes) and an upper layer with a large forbidden gap, this channel comprising a low mobility zone and a zone of greater mobility with its conduction being controlled by a polarization electrical field which preferably attracts the carriers into either zone, a semi-conductor device wherein the channel comprises two layers of semi-conductive material with a small forbidden gap, one layer with high mobility and the other layer with low mobility, separated by a barrier layer with a large forbidden gap, thin enough for the carriers to pass from the high mobility zone to the low mobility zone and in reverse by tunnel effect, during the variation of the polarization field.

BRIEF DESCRIPTION OF THE DRAWINGS

The invention will be better understood and its other characteristics will appear from the following description which is made with reference to the appended figures, of which:

FIG. 1 is a diagram of a heterojunction field-effect transistor according to a first alternative embodiment of the invention.

FIG. 2 is a cross-section diagram of a second alternative embodiment of the heterojunction field-effect transistor according to the invention;

FIGS. 3a and 3b are schematic drawings showing the distribution of loads, respectively in the example where the carriers are in the high mobility zone and in the example where they are in the low mobility zone.

FIG. 4 shows the distribution of charges in the case where the semi-conductive device of the invention is used with a variation in the number of carriers as a negative transconductance device.

FIG. 5 represents the conductance G (s) of the channel per unit of area s, as a function of the density of the carriers and according to the polarization field applied.

FIG. 6 shows the variation in conductivity as a function of the number of carriers firstly in the structure according to the invention and, secondly, in the most similar structure of the prior art.

DESCRIPTION OF THE PREFERRED EMBODIMENT

Generally, in a conventional field-effect transistor, a major parameter for the response time or, again, for the maximum gain frequency is the product of the source-gate capacitance and the source and gate access resistances. In principle, a conventional field-effect transistor requires a variation in the number of carriers in the channel. This parameter therefore represents an intrinsic limit on the speed of the transistor. As indicated above, the European patent application No. 0091831 has proposed a device which would, in principle, eliminate this variation in the charges of the channel. If a channel were created in a semi-conductive layer, for example in a layer of gallium arsenide (GaAs), between two layers of semi-conductor with a greater forbidden gap, for example, layers of aluminum and gallium arsenide alloy, and if a small number of donor impurities were introduced on one side of the channel and a large number of donor and acceptor impurities on the other side of the channel, the conductivity of the channel would then depend no longer on the quantity of carriers but on the distribution of these carriers in the channel. By controlling the mean position of the distribution of the charges with a standard gate and by a contact on the rear surface of the substrate between which a polarization field is applied, the immobility of the carriers in the channel can be modulated without varying their number. As indicated above, the size of the effect is small even at low temperature.

FIG. 1 represents the heterojunction and dual channel semi-conductor device according to the invention.

This semi-conductor device comprises an insulating substrate 10 on which various layers of semi-conductors, forming heterojunctions, are grown by molecular jet epitaxy. The first layer deposited 1 is a layer of semiconductive material with a small non-doped forbidden gap and high mobility. This layer may be, for example, a layer of gallium arsenide GaAs with a thickness $d_1$ in the region of 1 micrometer.

On this layer, a second semi-conductive layer 2 with a non-doped large forbidden gap and a thickness $d_2$ is grown, this thickness being small enough to provide for a quantal tunnel effect of the carriers through the layers. Typically, this layer may comprise an alloy of aluminium and gallium arsenide, $Al_x ga_{1-x} AS$, with a thickness ranging from 50 to 80 A for example.

On this second layer, a highly doped semi-conductive layer with a small forbidden gap 3 is grown with a thickness of $d_3$ which is small enough to enable the drift of the free carriers from the layer. This layer may typically be a layer of gallium arsenide GaAs doped by silicon atoms Si with $10^{18}$ atoms per $cm^3$ for example, on a thickness of about 50 A.

This layer is then lined with a semi-conductive layer with a large forbidden gap, this semi-conductive layer being possibly doped partially or throughout its thickness $d_4$, $d_4$ being determined in a known way so as to have no free carriers. This layer may be an aluminium and gallium arsenide alloy layer, like the layer 2, on a thickness of a few hundred A.

This structure is then completed by lateral source and drain contacts 5 and 6 respectively, one contact on the upper layer 4 forming a gate 7 and one rear contact 8 on the insulating substrate which may be deposited if necessary after thinning.

The working of this heterojunction semi-conductor device is the same as that of the transistor with modulated speed as described in the European patent application referred to above: by applying voltages to the two gates 7 and 8, $V_{G7}$ and $V_{G8}$ in order to have a conductive channel between the source and the drain, and by modulating these gate voltages in synchronization, the resistance between the source and the drain is modified without changing the number of carriers in the channel, but simply by confining the carriers to one or the other conductive layer with different mobilities. Owing to the barrier between the two layers, the confinement is far more distinct than in the previous structure and the variation in mobility observed is far greater, without compromising the swiftness with which the charges are transferred from one part of the channel to the other, for the thickness and height of the barrier are chosen so that the transfer is effective by tunnel effect. Thus the transfer of the carriers is used, in the invention, to cause variations, in a controlled manner, of mobility of the carriers in a channel which extends in a direction parallel to the barrier.

A second alternative embodiment of the heterojunction and dual channel semi-conductor device according to the invention is shown in FIG. 2. Like the preceding figure, this one shows an insulating substrate 10 and a heterojunction made up of the four layers 1, 2, 3 and 4 described above, which respectively have a small forbidden gap and high mobility (1), a large forbidden gap (2), a small forbidden gap and low mobility (3) and finally, a large forbidden gap (4), but the insulating substrate is separated from the non-doped conductive layer 1 by an additional layer with a large forbidden gap 9, formed for example, like the layers 2 and 4 of an alloy of aluminium and gallium arsenide. With this structure, it is possible to make the rear contact no longer on the rear surface of the insulating material 10, as in FIG. 1, but on the interface between the insulating substrate 10 and the additional layer with a large forbidden gap 9. A structure of this type may facilitate control by bringing the rear electrode closer to the active structure, and would be better suited for use in an integrated circuit.

FIGS. 3a and 3b illustrate the functioning of the heterojunction and dual channel semi-conductor device described above. They respectively show the minimum energy of the conduction bands $E_c$ in the various semiconductive layers and the distribution of carriers (Hatched zones) in these layers when the carriers are confined in the high mobility layer and in the low mobility layer respectively.

FIG. 5 shows the resultant mean conductance G(s) per unit of area s of the heterojunction semi-conductor device according to the invention, with its dual channel provided with a barrier depending on the density of the carriers. When a first electrical field $E_1$ of abut 2 volts per micrometer is applied to the device, between the rear gate 8 and the source 5, the conductance varies according to the density controlled by the voltage and the gate 7 and the source, the carriers remaining rather more confined within the low mobility zone. The maximum value of the conductivity is about $0.11 \times 10^{-2}$S (S=Siemens unit of conductivity and conductance) for a density of about 3 to $3.5 \times 10^{11}/cm^2$. For a second applied electrical field $E_2$ with value of about 1 volt per micrometer, the carriers pass rather into the high mobility zone and the conductance varies as a function of the density along a curve of the same shape as the first one but with higher levels of conductivity, the maximum value then being about $0.5 \times 10^{-2}$S. FIG. 6 shows the variation in conductivity G(s) when changing from the first field value to the second field value, depending on the density, firstly with the structure with a dual channel and barrier according to the invention and, secondly, with the structure having a dual zone but not a barrier, described in the prior art. This figure shows that, when the surface density of the carriers is about 3 to $5 \times 10^{11}$ carriers per $cm^2$, the variation in conductance that can be obtained bears a ratio 25 between the prior structure and the structure according to the invention ($0.02 \times 10^{-2}$S to $0.5 \times 10^{-3}$).

This structure is especially applicable to a field-effect transistor with a high response time, because it can be used at a constant density of carriers to vary the conductance with a high ratio and, therefore, without the delay caused by the capacitive effect which would be linked to an increase in the charge of the channel. However, as FIG. 5 shows, the conductance obtained with a device of this type may be reduced when the number of carriers is increased: the transconductance is then negative. The dual-channel and heterojunction device described above is therefore also applicable to a negative transconductance device having, within a range of gate voltage, a reduction of conductivity for an increase in the number of carriers of the conductive channel. Thus, a device of this type performs the action of a complementary transistor. The proposed device with an electrons channel increases the source-drain resistance by applying a positive gate voltage as is the case of a conventional transistor with a channel of holes. The highly doped part of the channel, i.e. the layer 3, must be thin enough to be a quantal well, the movement of the carriers in the direction perpendicular to the layers being then quantified. The negative transconductance is obtained by the following effect: the gate voltage controls the density of the carriers in the channel as in any field-effect transistor. At low density, the carriers are all in the high-mobility part of the channel, i.e. they are distributed as shown in the FIG. 3a shown above. The transconductance is then positive. In increasing the density, the lowest quantal level of the quantal well nears the Fermi level and the lowest level of the non-doped part of the channel. In this case, the doped part of the channel, i.e. the layer 3, begins to be filled, the result of which is that the mean mobility of the channel is reduced. But the major effect then results from the fact that, through a resonant tunnel effect, there is interaction between the levels of the two conductive parts of the channel, 1 and 3, and that the carriers are no longer strictly in either part of the channel. They are all in both parts of the channel, as shown in FIG. 4, and are all subjected to strong diffusion owing to the impurities of the doped part of the channel, i.e. the layer 3. The resultant reduction in mobility can be strong enough so that even the conductance of the channel is reduced although the number of carriers is increased. Finally, if the density of the carriers continues to be increased, the added carriers are preferably in the doped part 3 of the channel and the transconductance will once again be positive.

This transfer by resonating tunnel effect causes a controlled variation in the mobility of the carriers, concurrently with the barrier, since the current is in the source-drain direction. The condition for this type of functioning to exist is that the thickness of the conductive layer with reduced thickness 3 should be so thin that the perpendicular motion will be quantified and that, close to the pinch-off, its lowest quantal level is above the lowest level in the high-mobility non-doped conductive layer. Typically, for this use, the thickness $d_3$ of this layer is about 50 A with the materials described above, i.e. gallium arsenide doped with silicon atoms. Furthermore, the rear contact is not necessary. This effect will be all the greater as the temperature will be low. According to the results of the calculations shown in FIG. 5, the ratio between the maximum and minimum conductance of a channel of this type, obtained by an increase in the density of the carriers, can be about 3 to 6 at 77° K.

The invention is not limited to the embodiments specifically described and shown herein. In particular, it is possible to use materials other than those described, for example layers of InP for large-gap layers and layers of $In_{0.47}Ga_{0.53}As$ for small-gap layers, these proportions of indium and gallium being needed to obtain the same sized meshes for the superimposed layers and, hence, to obtain good quality interfaces between the various layers of the heterojunction.

Finally although, in the description of the invention, the channel electrons have implicitly been considered to be electrons and the doping atoms to be acceptors, it is clear that the invention can be applied, in a similar manner, to applications wherein the carriers are holes and the dopants are acceptors.

What is claimed is:

1. A heterojunction semiconductor device comprising an insulating substrate, a heterojunction along which a conductive channel extends between two electrodes, and an upper layer with a first forbidden gap, wherein said channel comprises between the substrate and the upper layer: a first layer of semiconductive material, a barrier layer, and a second layer of semiconductive material; said first and second layers having a second forbidden gap smaller than the forbidden gap of the upper layer, and said barrier layer having a forbidden gap of the same order as the forbidden gap of the upper layer; said first and second layers having different electrical mobilities, respectively low and high mobility, and said barrier layer being thin enough for the carriers to pass from the first to the second layer and from the second to the first layer by tunnel effect according to variations of a polarization electrical field applied to said channel causing variations in conduction of said channel.

2. The device according to claim 1 wherein the high mobility layer is a layer of non-doped semiconductive material and the low mobility layer is a layer of doped semiconductive material.

3. A device according to claim 1 wherein the barrier is a layer of non-doped alloy.

4. The device according to claim 1 wherein the high mobility layer is a layer of non-doped gallium arsenide, the low mobility layer is a layer of gallium arsenide doped with silicon atoms, and the upper and barrier layers are layers of gallium arsenide and aluminum alloy.

5. The device according to claim 1 wherein an additional layer with a forbidden gap of the same order of magnitude as the forbidden gap of the upper layer is between the insulating substrate and the first layer of semiconductive material.

6. The device according to claim 1 wherein the upper layer is doped along at least a part of its thickness.

7. The device according to claim 1 for use as a field effect transistor, wherein the barrier layer has a thickness, of about 50 to 80 angstroms, for enabling a transfer of carriers from one of said semiconductive layers to the other by tunnel effect, a polarization field being applied to said channel between an electrode on the insulating substrate and an electrode on the upper layer, in such a way that the number of carriers in the channel does not vary during changes in polarization.

8. The device according to claim 1 for use as a negative transconductance device, wherein the low mobility layer has a substantially small thickness, typically of 50 angstroms so that the first and second layers interact by tunnel effect when the density of carriers exceeds a first threshold, controlled by increasing the polarization of an electrode set on the upper layer, but stays below a second threshold beyond which no tunnel effect occurs.

9. The device according to claim 2 wherein the barrier layer is a layer of non-doped alloy.

* * * * *